United States Patent
Beffa

(10) Patent No.: US 10,009,012 B2
(45) Date of Patent: Jun. 26, 2018

(54) DISCRETE TIME FILTER, COMMUNICATION UNIT, AND METHOD FOR RESONANT CHARGE TRANSFER

(71) Applicant: MEDIATEK Singapore Pte. Ltd., Singapore (SG)

(72) Inventor: Federico Alessandro Fabrizio Beffa, Fescoggia (CH)

(73) Assignee: MediaTek Singapore Pte, Ltd, Solaris (SG)

(*) Notice: Subject to any disclaimer, the term of this patent is extended or adjusted under 35 U.S.C. 154(b) by 83 days.

(21) Appl. No.: 15/205,150

(22) Filed: Jul. 8, 2016

(65) Prior Publication Data
US 2017/0012607 A1    Jan. 12, 2017

Related U.S. Application Data

(60) Provisional application No. 62/189,940, filed on Jul. 8, 2015, provisional application No. 62/192,142, filed on Jul. 14, 2015.

(51) Int. Cl.
*H03H 15/00* (2006.01)
*H03H 21/00* (2006.01)
(Continued)

(52) U.S. Cl.
CPC ........... *H03H 15/023* (2013.01); *G06F 17/11* (2013.01); *H03H 15/00* (2013.01);
(Continued)

(58) Field of Classification Search
CPC ............. H03H 15/00; H03H 2015/007; H03H 17/0635; H03H 17/065; H03H 17/0664;
(Continued)

(56) References Cited

U.S. PATENT DOCUMENTS 7,539,721 B2 * 5/2009 Belveze ................ H03H 15/00
 708/819
2009/0284285 A1 * 11/2009 Fagg .................... H03H 19/004
 327/91
(Continued)

FOREIGN PATENT DOCUMENTS

EP    3116125 A1 *   1/2017   ............. G06F 17/11

OTHER PUBLICATIONS

L. Duipmans, R. Struiksma, E. Klumperink, B. Nauta, F. van Vliet, "Analysis of the signal transfer and folding in N-path filters with a series inductance", IEEE Trans. Circuits Syst. I Reg. Papers, vol. 62, No. 1, pp. 263-272, Jan. 2015.*

(Continued)

*Primary Examiner* — Matthew Sandifer
(74) *Attorney, Agent, or Firm* — Optimus Patents US, LLC

(57) ABSTRACT

A discrete time filter, DTF, is described that comprises a summing node; N parallel branches, each branch having a set of input unit sampling capacitances where each unit sampling capacitance is independently selectively coupleable to the summing node; and an output capacitance connected to the summing node. The output capacitance has a value equal to a sum of the sampling capacitances that are to be selectively connected to the summing node; and the discrete time filter further comprises an inductance connected between the summing node and the output capacitance.

20 Claims, 9 Drawing Sheets

(51) Int. Cl.
*G06F 17/11* (2006.01)
*H04B 1/00* (2006.01)
*H04B 1/26* (2006.01)

(52) U.S. Cl.
CPC ....... *H03H 21/0023* (2013.01); *H04B 1/0014* (2013.01); *H04B 1/0017* (2013.01); *H04B 1/26* (2013.01)

(58) Field of Classification Search
CPC .. H03H 19/00–19/002; H04B 1/0017–1/0021; H04B 1/0042–1/0046
USPC .................................................. 708/313, 819
See application file for complete search history.

(56) References Cited

U.S. PATENT DOCUMENTS

| | | |
|---|---|---|
| 2009/0322418 A1 | 12/2009 | Burke |
| 2010/0167685 A1 | 7/2010 | Burke et al. |
| 2014/0194081 A1* | 7/2014 | Tohidian .............. H04B 1/0007 455/258 |
| 2015/0214926 A1* | 7/2015 | Tohidian ................ H03D 7/125 333/173 |

OTHER PUBLICATIONS

S. Pavan and E. Klumperink, "Analysis of the Effect of Source Capacitance and Inductance on N-Path Mixers and Filters," in IEEE Transactions on Circuits and Systems I: Regular Papers, vol. PP, No. 99, pp. 1-12.*

* cited by examiner

DISCRETE TIME FILTER, COMMUNICATION UNIT, AND METHOD FOR RESONANT CHARGE TRANSFER

FIELD OF THE INVENTION

The field of this invention relates to a discrete time filter, a communication unit and method for resonant charge transfer therein.

BACKGROUND OF THE INVENTION

A primary function of a wireless receiver is to down-convert the received wanted radio frequency signal to a baseband and/or digital form in order to process the wanted signal. In order to selectively extract the wanted signal from noise or other undesired signals, filters are used. Filters are employed at various stages of a receiver's architecture, from analog radio frequency (RF) filters through to digital filters. A digital filter operates on a discrete time sample set, where the value of the samples has been rounded to the nearest value from a finite set of possible values, typically represented as a binary number.

An analog discrete time filter (DTF) operates on a discrete time sample set, where the value of the samples is continuous (typically a real number), and where digitization occurs in an analog-to-digital converter (ADC) located after this filter. DTFs have two forms, i.e. Finite Impulse Response (FIR) and Infinite Impulse Response (IIR). In receivers having FIR DTFs, it is known that sampling capacitances need to be accurately matched.

Referring now to FIG. 1, a known example of a decimate-by-2 FIR discrete time filter 100 is illustrated. The decimate-by-2 FIR discrete time filter 100 includes a source voltage 110 coupled via a source resistance 112 to an input port 114 receiving an input voltage.

A full filter is made of N-branches 116, but each branch does not form a full filter by itself, just a sampling capacitor Cs or, in general, a set of sampling capacitors Cs. Control of the N branches of FIR DTFs is typically implemented by means of transistor switches with small conducting resistances $R_{ON}$. In this manner, sampling capacitors Cs 126 in each branch are selectively coupled to the input by a set of respective switches (ϕ0, ϕ1, ϕ2) 122. The sampling capacitors Cs 126 in each branch are selectively coupled to the output by a further set of respective switches (α0, α1, α2) 128. The sampling capacitors Cs 126 in each branch are selectively reset by a further set of respective switches (θ0, θ1, θ2) 124. The outputs from the N-branches 116 are then combined (summed) and coupled to an output capacitor (Cout) 120 to provide an output voltage Vout from the decimate-by-2 FIR discrete time filter 100. The charge of the output capacitor (Cout) 120 is selectively maintained or discharged by means of an output capacitor reset switch 118 (β0).

A simplified representation of the output side of the decimate-by-2 FIR discrete time filter 100 during the time interval during which two of the three output switches are closed is illustrated at 150, with a sampling capacitor Cs 126 in each of two out of three branches being coupled to the output capacitor (Cout) 120 by respective small conducting resistances $R_{ON}$ 152 that represent closed transistor switches. A full representation of the filter during the time interval in question would include the third capacitor being connected to the input.

However, DTFs are known to suffer from a number of problems. For example, in the process of constructing the output signal sample through charge sharing between sampling capacitors Cs 126 and output capacitor (Cout) 120, these small $R_{ON}$s 152, together with the sampling and output capacitors, form a circuit with a wide noise bandwidth, substantially larger than the output sampling frequency. This results in substantial noise aliasing.

The time period described above and represented in 150 of FIG. 1 corresponds, to a timing interval [0, ½*1/fs], with all other time intervals during which any two from amongst the switches 128 are open. The switches are controlled by signals α0, α1, α2. During these time periods, only the output switches' noise is added to the signal. The full operation of the filter is, however, composed of additional phases. During these additional phases, additional noise sources add noise on top of the signal, e.g. noise generated by the source resistor Rs 112, the input switches $R_{ON}$ ϕ122 and the reset switches $R_{ON}$ θ124 is also added to the signal. In decimating DTF the noise added by the output switches is often the dominant noise contribution because of the lower output sampling frequency.

Furthermore, in transferring the charge from multiple sampling capacitances 126 to an output capacitance, only part of the total charge 'Q' stored on the sampling capacitors 126 is transferred to the output capacitor $C_{out}$ 120 in passive DTFs of the type illustrated in FIG. 1, sometimes referred to as 'charge redistribution'. This results in attenuation of the output voltage. For example, in a decimation-by-2 FIR filter, this occurs by averaging, say, 2 successive samples at a time. The maximum magnitude of the voltage transfer function (TF) is, thus:

$$\text{Max}(|TF(f)|) = 2C_s/(2C_s + C_{out}).\qquad [1]$$

As a consequence of the significant signal attenuation, and increased noise levels, DTFs are currently only used in baseband processing, i.e. once signal amplification/noise reduction has been performed, so that this inherent signal attenuation and reduction in noise can be tolerated.

Thus, a need exists for an improved DTF design that may be more tolerant of, or address, noise levels and/or signal attenuation.

SUMMARY OF THE INVENTION

Accordingly, the invention seeks to mitigate, alleviate or eliminate one or more of the above mentioned disadvantages singly or in any combination. Aspects of the invention provide a discrete time filter, DTF, a wireless communication unit and a method therefor as described in the appended claims.

According to a first aspect of the invention, there is provided a discrete time filter, DTF, comprising: a summing node; N parallel branches, each branch having a set of input unit sampling capacitances where each unit sampling capacitance is independently selectively coupleable to the summing node; and an output capacitance connected to the summing node. The output capacitance has a value equal to a sum of the sampling capacitances that are to be selectively connected to the summing node; and the discrete time filter further comprises an inductance connected between the summing node and the output capacitance.

Advantageously, and as described in greater detail below, the known problem of discrete time filters is resolved by means of resonant charge transfer. This is achieved by configuring the output capacitance value to be equal to a sum of the set of unit sampling capacitances that are individually and selectively connected to it, leading to the same capacitance being at both sides of the inductance. For example, in a decimate-by-2 FIR DTF, $C_{out}=2C_s$. The filtering properties of the inductance together with the sampling capacitances and the output capacitance also reduce the noise band width.

According to some optional embodiments, the series inductance, together with capacitances located at either side of the series inductance, may be configured to effect resonance at a frequency to facilitate a resonant charge transfer. In some examples, each input unit sampling capacitance may be independently selectively coupleable to the summing node via a respective output switch, wherein the resonance frequency of an output resonant circuit that comprises the set of input unit sampling capacitances coupled to the output capacitance via the inductance, is based on a time interval τ during which the output switches are closed.

In some examples, the resonant charge transfer may include all of the charge being transferred from the respective set of input unit sampling capacitances to the output capacitance, $C_{out}$. In this manner, a resonant charge transfer with substantially no loss of signal can be achieved.

According to some optional embodiments, the output capacitance, $C_{out}$, may be equal to a total capacitance of the set of unit sampling capacitances that are individually and selectively connected to an output node of the DTF at an instant in time.

According to some optional embodiments, a number of the N parallel branches may be selectively coupled to the output capacitance thereby performing a resonant charge transfer from a respective set of input unit sampling capacitances of the, or each, selected branch to the output capacitance.

According to some optional embodiments, each unit sampling capacitance of each of the N parallel branches is coupled to an input switch, a reset switch and an output switch, and the output capacitance, $C_{out}$, is coupled to a output capacitor reset switch. In some examples, the series inductance, together with capacitances located at either side may be configured to effect a resonant charge transfer during a period of time between a rising clock event whereby the sampling capacitances of a number of selected N parallel branch are coupled to the output capacitance and a falling clock event that disconnects the sampling capacitances of the number of selected N parallel branch from the output capacitance.

According to some optional embodiments, the discrete time filter may further comprise a controller coupled to each switch and configured to effect a switch close time of the output switches that is one half of a period of a resulting resonant charge transfer.

According to some optional embodiments, the set of input unit sampling capacitances, $C_s$, may be configured to form a decimate-by-2 finite impulse response, FIR, DTF.

According to some optional embodiments, the set of input unit sampling capacitances, $C_s$, may be configured to form a cascade-by N decimate-by-R cascaded integrator-comb (CIC) finite impulse response, FIR, DTF. In some examples, the series inductance in the CIC FIR DTF may be used to build a filter where the weighting coefficients of a z-Transform describing the CIC FIR DTF are not all equal.

According to a second aspect of the invention, there is provided a wireless communication unit comprising a discrete time filter, DTF, comprising: a summing node; N parallel branches, each branch having a set of input unit sampling capacitances where each unit sampling capacitance is independently selectively coupleable to the summing node; and an output capacitance connected to the summing node. The output capacitance has a value equal to a sum of the sampling capacitances that are to be selectively connected to the summing node; and the discrete time filter further comprises an inductance connected between the summing node and the output capacitance.

According to a third aspect of the invention, there is provided a method of effecting a resonant charge transfer in a discrete time filter comprising a summing node, N parallel branches, each branch having a set of input unit sampling capacitances and an output capacitance connected to the summing node. The method comprises: independently selectively coupling a plurality of unit sampling capacitances to the summing node, which is connected to an output capacitance via an inductance, wherein the output capacitance has a value equal to a sum of the sampling capacitances that are selectively coupled to the summing node, and effecting a resonant charge transfer from the selected plurality of unit sampling capacitances to the output capacitance.

In some examples, the output capacitance, inductance, and sampling capacitances that are selectively coupled to the inductance may form an output resonant circuit where the resonant frequency is based on a time interval τ during which output switches of the DFT coupling the plurality of unit sampling capacitances to the output capacitance are closed.

In some examples, the time interval τ may correspond to half a resonance period of the output resonant circuit formed by the inductor and the capacitors connected to it.

In some examples, effecting a resonant charge transfer from the selected plurality of unit sampling capacitances to the output capacitance may comprise the resonant charge transfer transferring all of the charge from the respective set of input unit sampling capacitances to the output capacitance.

In some examples, the output capacitance, $C_{out}$, is equal to a total capacitance of the set of unit sampling capacitances that are individually and selectively connected to an output node of the DTF at an instant in time.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

Examples of the invention will be described in terms of a hardware-based discrete-time filter design, where problems of signal attenuation and noise are prevalent. Although examples of the invention are described with reference to a DTF for a wireless communication unit, it is envisaged that the disclosed DTF may be applied to a multitude of everyday electronic components and products, such as mobile radios, radio receivers, audio-video receivers, etc.

In accordance with some example embodiments of the invention, there is provided a discrete time filter, DTF, comprising: a summing node; N parallel branches, each branch having a set of input unit sampling capacitances where each unit sampling capacitance is independently selectively coupleable to the summing node; and an output capacitance connected to the summing node. The output capacitance has a value equal to a sum of the sampling capacitances that are to be selectively connected to the summing node; and the discrete time filter further comprises an inductance connected between the summing node and the output capacitance.

The balancing of the combination of sampling capacitances that are individually and selectively coupled to the summing node, and thereafter to the output capacitance via the inductance, effects a resonance at a frequency that facilitates a resonant charge transfer. The resonance frequency of the output resonant circuit is based on a time interval during which the output switches are closed, which is a fraction of the sampling period.

In some examples, this enables the signal attenuation to be suppressed, that is, the signal transfer function is increased from $2C_s/(2C_s+C_{out})$ to 1. Furthermore, and advantageously, as described in greater detail below, the introduction of the inductance reduces a thermal noise bandwidth of the output switches thereby reducing noise aliasing. For example, for a decimate-by-2 FIR filter, the noise aliasing as represented by the $BW_n/f_d$ term in the noise spectral density equation [2] may reduce, say to ~2 (from say 10).

In some examples, the output capacitance of the DTF may be represented by the input capacitance of a following stage, and as such the output capacitance feature is considered as encompassing both of these options hereafter.

Figure 1:
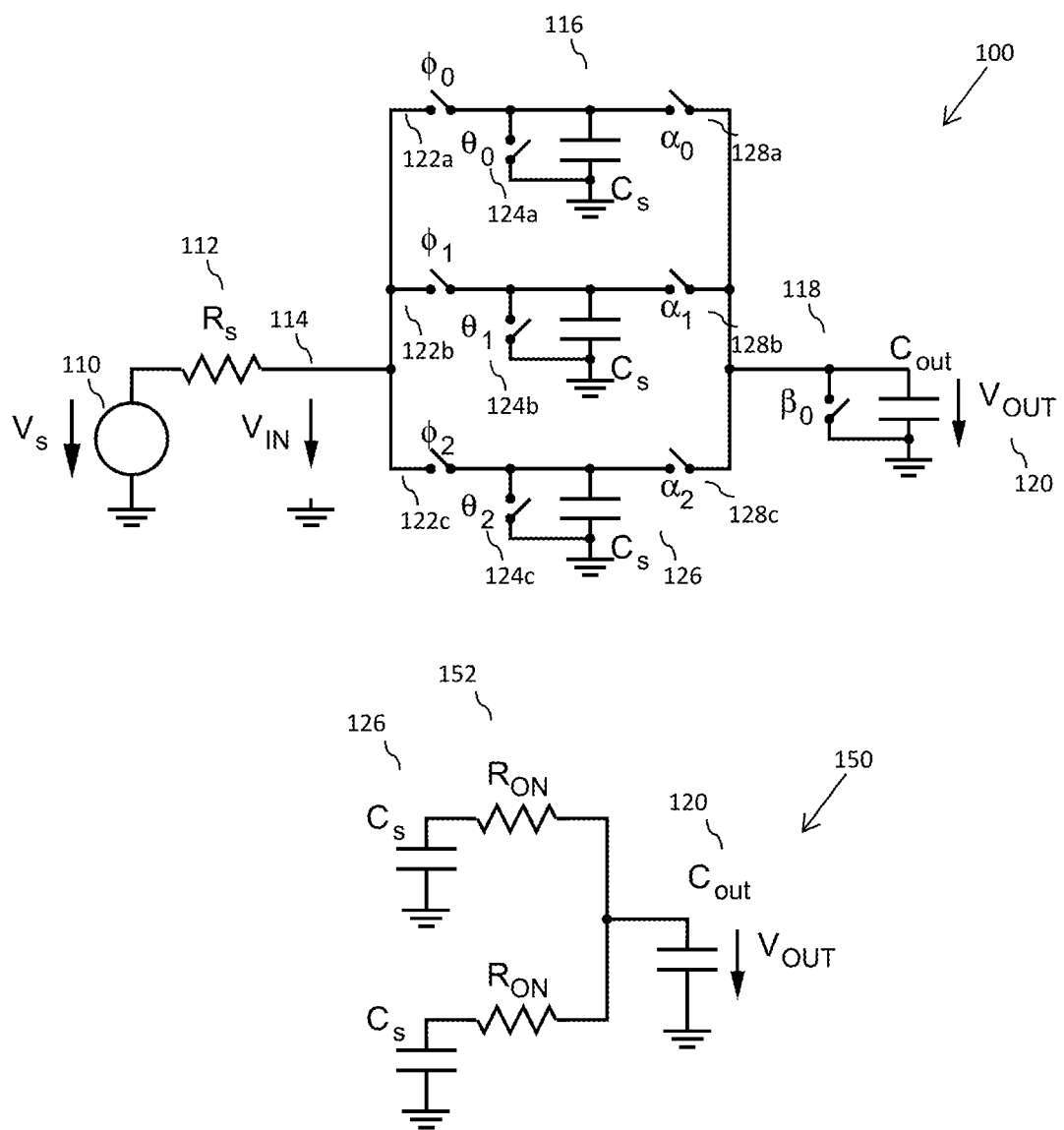
FIG. 1 illustrates a known example of a decimate-by-2 finite impulse response (FIR) discrete time filter (DTF).
Figure 2:
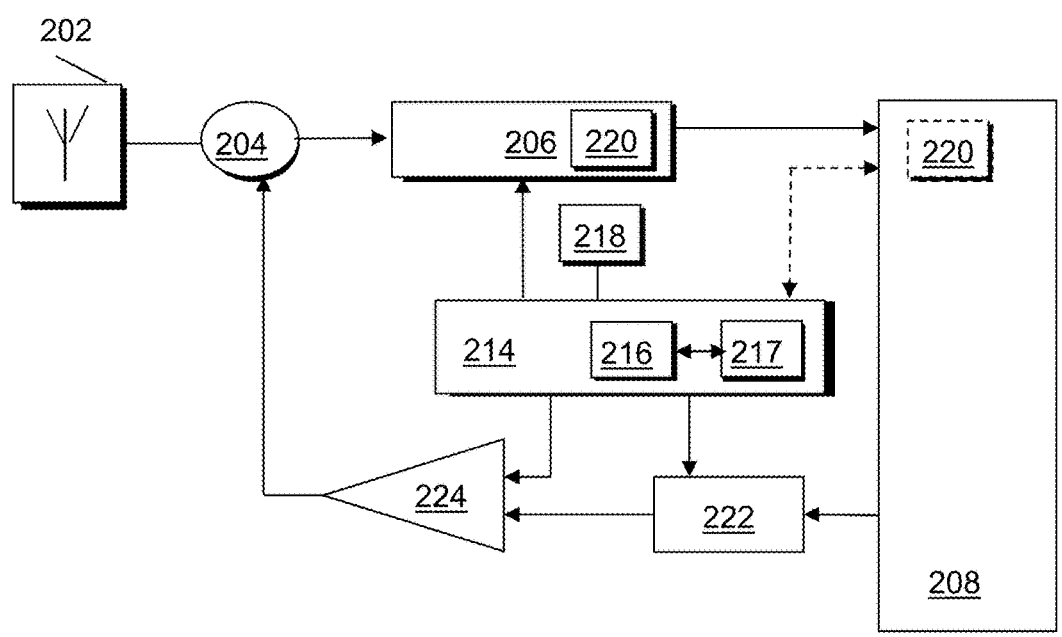
FIG. 2 schematically illustrates a simplified example of a part of a wireless communication unit.

Referring now to FIG. 2, there is illustrated a simplified block diagram of a wireless communication unit 200, adapted in accordance with some example embodiments of the invention, is shown. In practice, purely for the purposes of explaining embodiments of the invention, the wireless communication unit is described in terms of a wireless subscriber communication unit, such as a user equipment (UE) that in some examples may be a smartphone. In other examples, any wireless device with a processor or circuit arranged to perform discrete time filtering may be used.

The wireless communication unit 200 contains an antenna arrangement 202, for radiating or receiving transmissions, coupled to an antenna switch or duplexer 204 that provides isolation between receive and transmit chains within the wireless communication unit 200.

As known in the art, one or more receiver chains is/are coupled to antenna switch or duplexer 204 and include(s) receiver front-end circuitry 206 (effectively providing reception, filtering and intermediate or base-band frequency conversion). The receiver front-end circuitry 206 is coupled to a signal processing module 208 (generally realized by a digital signal processor (DSP)). A skilled artisan will appreciate that the level of integration of receiver circuits or components may be, in some instances, implementation-dependent.

A controller 214 maintains overall operational control of the wireless communication unit 200. The controller 214 is coupled to the receiver front-end circuitry 206 and the signal processing module 208. In some examples, the controller 214 is also coupled to a buffer module 217 and/or a memory device 216 that selectively stores operating regimes, such as antenna tuning information, and the like. A timer 218 is operably coupled to the controller 214 to control the timing of operations (e.g. transmission or reception of time-dependent signals) within the wireless communication unit 200.

The transmit chain includes transmitter/modulation circuitry 222 and a power amplifier 224 coupled to the antenna arrangement 202, which may comprise for example an antenna array, or plurality of antennas. The transmitter/modulation circuitry 222 and the power amplifier 224 are operationally responsive to the controller 214.

In this example, a discrete time filter, DTF, 220, located in the receiver front-end circuitry 206 is configured to include a summing node; N parallel branches, each branch having a set of input unit sampling capacitances where each unit sampling capacitance is independently selectively coupleable to the summing node; and an output capacitance connected to the summing node. The output capacitance has a value equal to a sum of the sampling capacitances that are to be selectively connected to the summing node; and the discrete time filter further comprises an inductance connected between the summing node and the output capacitance. In other examples, the DTF may be located in the signal processing module 208.

Figure 3:
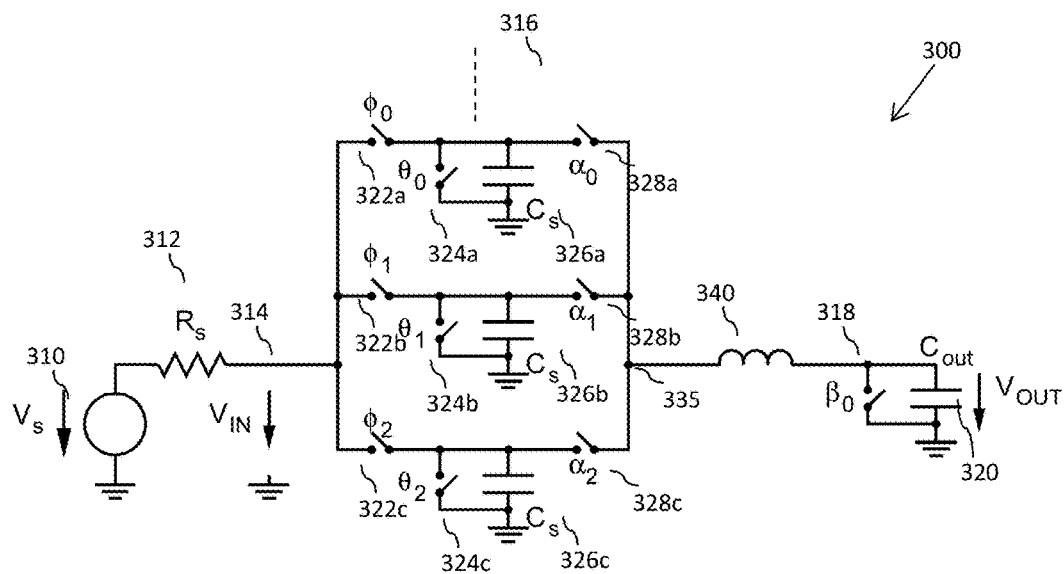
FIG. 3 illustrates a simplified circuit diagram of an example of a discrete time filter employing resonance charge transfer, together with an equivalent circuit diagram of the output side network during resonant charge transfer, in accordance with examples of the invention.
Figure 3:
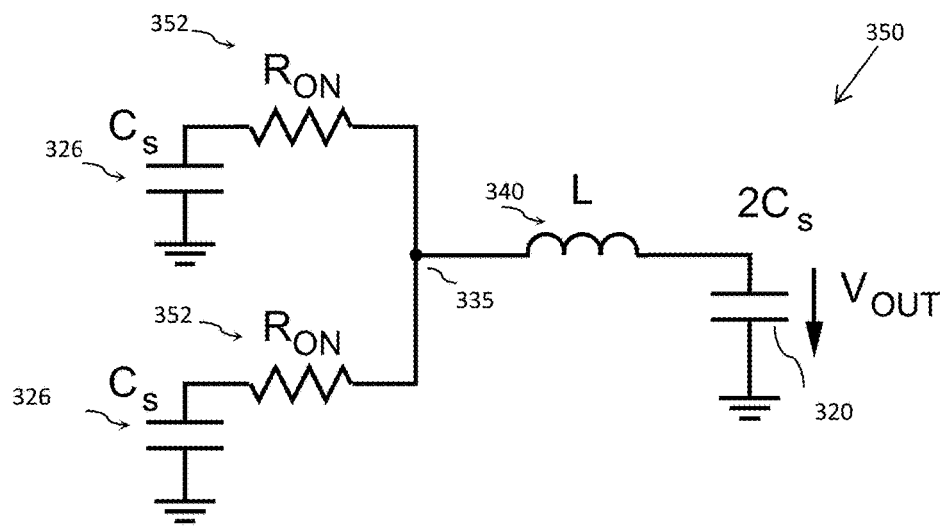

Referring now to FIG. 3, a first example of a decimate-by-2 FIR discrete time filter 300 adapted in accordance with example embodiments of the invention is illustrated. The decimate-by-2 FIR discrete time filter 300 includes a source voltage 310 coupled via a source resistance 312 to an input port 314 receiving an input voltage. An N-branch parallel network 316 includes source capacitors Cs 326 in each branch. Control of the N branches of FIR DTFs is typically implemented by means of transistor switches with small conducting resistances $R_{ON}$. In this manner, sampling capacitors Cs 326 in each branch are selectively coupled to the input by a set of respective input switches 322a ($\phi$0), 322b ($\phi$1), 322c ($\phi$2). The sampling capacitors Cs 326 in each branch are selectively coupled to the output by a further set of respective output switches 328a ($\alpha$0), 328b ($\alpha$1), 328c ($\alpha$2). The sampling capacitors Cs 326 in each branch are selectively reset by a further set of respective reset switches 324a ($\theta$0), 324b ($\theta$1), 324c ($\theta$2). The outputs from a set of the N-branch parallel network 316 are then combined (summed) and coupled to an output capacitor (Cout) 320 to provide an output voltage Vout from the decimate-by-2 FIR discrete time filter 300. The charge of the output capacitor (Cout) 320 is selectively maintained or discharged by means of a output capacitor reset switch 318 (β0). In this example, decimate-by-2 FIR DTF, two sampling capacitors Cs 326 out of three branches are connected to the output.

A simplified representation of the process of building an output sample value of the decimate-by-2 FIR discrete time filter 300, for the output side network during resonant charge transfer, is illustrated at 350, with a sampling capacitor Cs 326 in two out of three branches being coupled to the output capacitor (Cout) 320 by respective small conducting resistances $R_{ON}$ 352 that represent closed transistor switches. As would be appreciated, a full representation of the filter would include the $3^{rd}$ sampling capacitor that is being connected to the source at the moment when the two sampling capacitor Cs 326 are connected to the output capacitor (Gout) 320. Of course, during other time intervals, the connections are different and, hence, the network may not represent the filter.

In the process of constructing the output signal sample through charge sharing between sampling capacitor Cs 326 and output capacitor (Gout) 320, these small $R_{ON}$s 352, together with the sampling and output capacitors, form a circuit with a wide noise bandwidth, substantially larger than the output sampling frequency. In FIG. 3 the process of 'charge sharing' is transformed to a 'resonant charge transfer' by the presence of the inductor with a consequent substantial reduction of noise aliasing. For example, the single sideband (SSB) spectral noise density at the output of a decimation-by-2 FIR filter without the inductor, due to the thermal noise associated with the output switches may be calculated as:

$$N(w) = 4kT \frac{R_{ON}}{2} \cdot \left(\frac{t_{SH}}{T_d}\right)^2 \left|\frac{\sin\left(p \frac{w}{w_d} \frac{t_{SH}}{T_d}\right)}{p \frac{w}{w_d} \frac{t_{SH}}{T_d}}\right|^2 \left|\frac{2C_s}{2C_s + C_{out}}\right|^2 \frac{BW_N}{f_d} \quad [2]$$

With $f_d=1/T_d=\omega_d/2\pi$ the output sampling frequency, $\tau_{SH}$ the sample-and-hold time applied to the switches; and $BW_n$ the noise bandwidth given by:

$$BW_N = \frac{1}{R_{ON} \frac{2C_s C_{out}}{2C_s + C_{out}} 4} \quad [3]$$

The noise bandwidth contribution to the SSB spectral noise density in [2] is dependent on the last bandwidth factor (BWn/fd) given in [3]. The noise bandwidth factor (BWn/fd) is due to aliasing and is not present in the signal power spectral density S(ω). This factor is therefore responsible for a high Noise Figure. As a consequence, examples of the invention have targeted a reduction in the input signal bandwidth to reduce the noise.

Thus, in accordance with examples of the invention, a series inductance 340 is introduced between a summing junction 335 of the DTF and the output capacitor reset switch 318 (β0) that is in parallel to output capacitance 320. The series inductance 340, together with (substantially) the same capacitance located at either side of the series inductance 340 is configured to form an output resonant circuit.

fs denotes the input sampling frequency; and fd=fs/R denotes the output sampling frequency. From the timing diagram of FIG. 4 we see that the time during which the output switches are closed is ½ of 1/fs: τ=½*(1/fs). In practice, to avoid having the input switches and the output switches all conducting at the same time, it should be slightly less than this, say, τ=0.9*½*(1/fs).

Since the capacitance at both ends of the inductor must be equal and the output capacitance is Cout, the total capacitance in series with the inductor is $C_{out}/2$. The value of the series inductance 340 depends on frequency and the values of the sampling capacitances, as highlighted in equation [4], with typical values ranging from ~10 nH to a few hundreds of nH.

$$L = \frac{1}{\left(\frac{2p}{2t}\right)^2 \frac{C_{out}}{2}} \quad [4]$$

As can be seen in equation [4], a resonance frequency of the output resonant circuit that comprises the set of input unit sampling capacitances coupled to the output capacitance via the inductance, is based on a time interval τ during which the output switches are closed. In this manner, a slightly different timing between the open and closing of reset switches can be tolerated within equation [4].

In examples of the invention, a skilled artisan will recognise that a value of L around a target value defined in equation [4] above, will still create a resonance frequency. For example, in some situations, an inductance value for L may be achieved within a ±4% margin of the value defined in equation [4], which may increase if the values for the output capacitance and sampling capacitances vary from the target values. Furthermore, in accordance with some examples of the invention and acknowledging that components have tolerances, it is envisaged that the resonant charge transfer of the voltage from the sampling capacitances that are selectively connected to the summing node and the output capacitance may yield, say, 80-100% of a full charge transfer.

In this manner, by designing the circuit to include a resonance between the output node of the DTF set of sampling capacitors and the output capacitance 320, a substantially full charge transfer can be advantageously achieved. The introduction of the series inductance 340 also reduces the bandwidth significantly, thereby reducing the noise aliasing created by the DTF.

Figure 4:
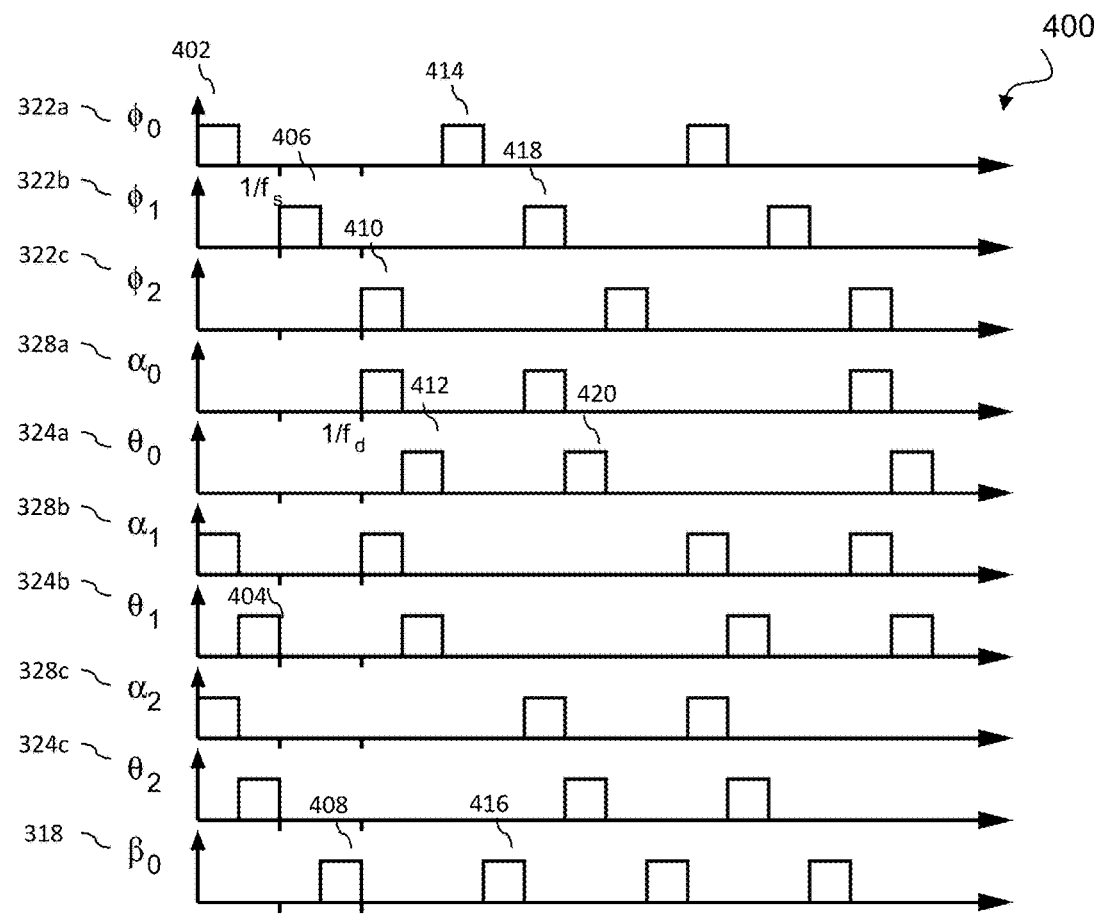
FIG. 4 illustrates a simplified timing diagram of an Illustration of a process of constructing the output sample value using a decimate-by-2 FIR DTF, in accordance with examples of the invention.

Referring now to FIG. 4, a simplified timing diagram 400 illustrates a process of constructing the output sample value in FIG. 3, using a decimate-by-2 FIR discrete time filter.

During time period 402, input switch 322a (φ0) and output switches 328b (α1), 328c (α2) are closed. All other switches remain open. This enables top sampling capacitor 326a to be charged from the input voltage 314, whilst the bottom two sampling capacitors 326b and 326c transfer their combined charge to output capacitor (Cout) 320.

During time period 404, input switch 322a (φ0) and output switches 328b (α1), 328c (α2) are opened, whilst reset switches 324b (θ1), 324c (θ2) are closed. All other switches remain open. This enables the bottom two sampling capacitors 326b and 326c to be reset before re-charging, if desired, by removing any memory effects of the charge.

During time period 406, input switch 322b (φ1) is closed. All other switches remain open. This enables the second sampling capacitor 326b to be charged from the input voltage 314.

During time period 408, output capacitor reset switch 318 (β0) is closed. All other switches remain open. This enables the output capacitor 320 to be reset before re-charging, if desired, by removing any memory effects of the charge.

During time period 410, input switch 322c (φ2) together with output switches 328a (α0), 328b (α1) are closed. All other switches remain open. This enables bottom sampling capacitor 326c to be charged from the input voltage 314, whilst the top two sampling capacitors 326a and 326b transfer their combined charge to output capacitor (Cout) 320.

During time period 412, input switch 322c (φ2) and output switches 328a (α0), 328b (α1) are opened, whilst reset switches 324a (θ0), 324b (θ1) are closed. All other switches remain open. This enables the top two sampling capacitors 326a and 326b to be reset before re-charging, if desired, by removing any memory effects of the charge.

During time period 414, input switch 322a (φ0) is closed. All other switches remain open. This enables top sampling capacitor 326a to be charged from the input voltage 314.

During time period 416, output capacitor reset switch 318 (β0) is closed. All other switches remain open. This enables the output capacitor 320 to be reset before re-charging, if desired, by removing any memory effects of the charge.

During time period 418, input switch 322b (φ1) and output switches 328a (α0), 328c (α2) are closed. All other switches remain open. This enables second capacitor 326b to be charged from the input voltage 314, whilst the top and bottom sampling capacitors 326a and 326c transfer their combined charge to output capacitor (Cout) 320.

During time period 420, input switch 322b (φ1) and output switches 328a (α0), 328c (α2) are opened, whilst top and bottom reset switches 324a (θ0), 324c (θ2) are closed. All other switches remain open. This enables the top and bottom sampling capacitors 326a and 326c to be reset before re-charging, if desired, by removing any memory effects of the charge.

This charging, transferring of charge and resetting operation continues as shown, in response to the control of the various switches.

Figure 5:
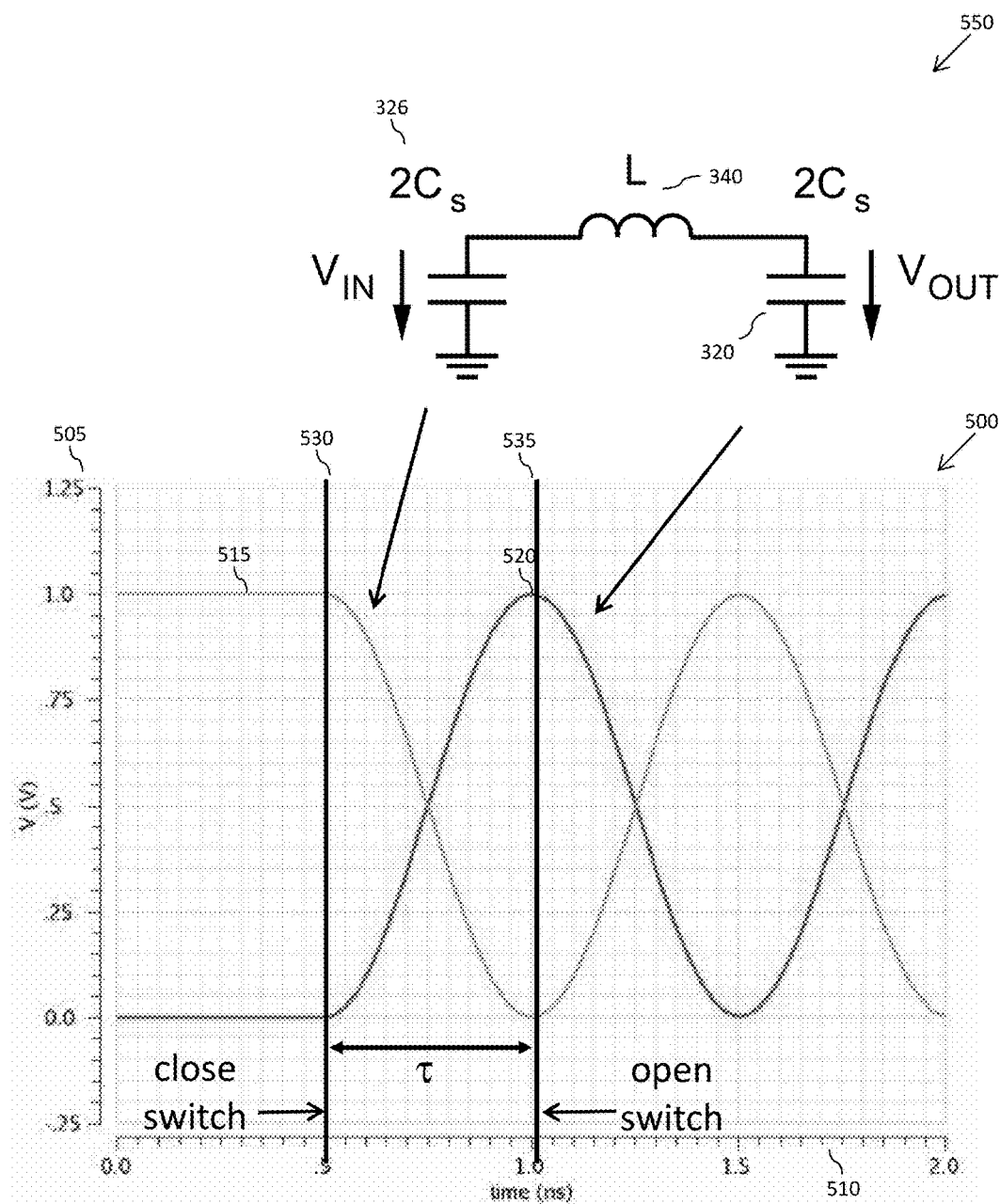
FIG. 5 illustrates a timing diagram illustrating the charge transfer from the sampling capacitance to the output capacitance within the circuit illustrated in FIG. 3.

Referring now to FIG. 5, a voltage vs. timing diagram 500 illustrates a charge transfer from a set of unit sampling capacitances (represented by a single capacitance 326 for simplicity) to the output capacitance 320 within the circuit illustrated in FIG. 3. In this circuit, the sum of the capacitance of the two selected sampling capacitances 326 out of three sampling capacitors that are connected to the output node are configured to match the output capacitance 320. Furthermore, in this circuit, the totality of the sampling capacitance 326 is separate from the output capacitance 320 by inductance 340. As shown, the voltage vs. timing diagram 500 illustrates a maximum charge transfer 515 from the sampling capacitance 326 to the output capacitance 320, at a first time instant 530, which represents the time instant at which a set of the output switches are closed (driven by signals $\alpha_{i,k}$). Time instant 535 is the time instant at which said switches are opened.

In particular, the time period between these two instants 530, 535 is denoted by τ, namely the time period during which a set of the output switches is closed for the purpose of constructing an output sample value.

Referring to FIG. 5, the term "resonant charge transfer" is used to denote the process of transferring all of the charge stored on the set of unit sampling capacitances (represented by 326) on the left hand side of the inductor 340, to the output capacitance 320 on the right hand side of the inductor 340 through the inductance L. The time interval τ required to perform this 'resonant charge transfer', is dependent upon the value of the inductance L and the value of the capacitance $C_{out}$ (i.e. 2*Cs) at both ends of the inductor 340, with the relationship defined in equation [4].

It is envisaged that the concepts described herein can be applied to a large set of FIR DTF filter types or configurations. For example, suppose we have a filter with a z-transform of:

$$H1(z)=1+z^\wedge(-1)+z^\wedge(-2) \quad [5]$$

When this is extrapolated a cascade of 3 (N=3) decimation by 3 (R=3) filters, with respect to the input side clock, results in a z-Transform of:

$$\begin{aligned} H(z) &= H1(z) * H1(z) * H1(z) \quad [6] \\ &= [1 + z^\wedge(-1) + z^\wedge(-2)]^\wedge 3 \\ &= 1 + 3z^\wedge(-1) + 6z^\wedge(-2) + 7z^\wedge(-3) + 6z^\wedge(-4) + \\ &\quad 3z^\wedge(-5) + z^\wedge(-6) \end{aligned}$$

The spectrum of the ideally sampled signal is given in equation [6], with z replaced by the expression in equation [7]:

$$z = e^{j2p\frac{f}{f_s}} \quad [7]$$

One may choose to implement the filter described by H(z) as the cascade of three filters, each one described by H1(z), or, in some examples, by a single filter directly implementing the full H(z). Thus, the z-Transform is a way of characterizing the input-output characteristic of a discrete time system without reference to how the filter is actually implemented. In the following example we describe a filter whose z-Transform is commonly referred to as the one of a cascade of 3 decimate-by-3 cascaded integrator-comb (CIC) FIR DTF.

A filter implementation of a set of nine unit sampling capacitors does not appear as a cascade of filters, but its transfer function is the same. Decimation is performed at the output in both cases.

Figure 6:
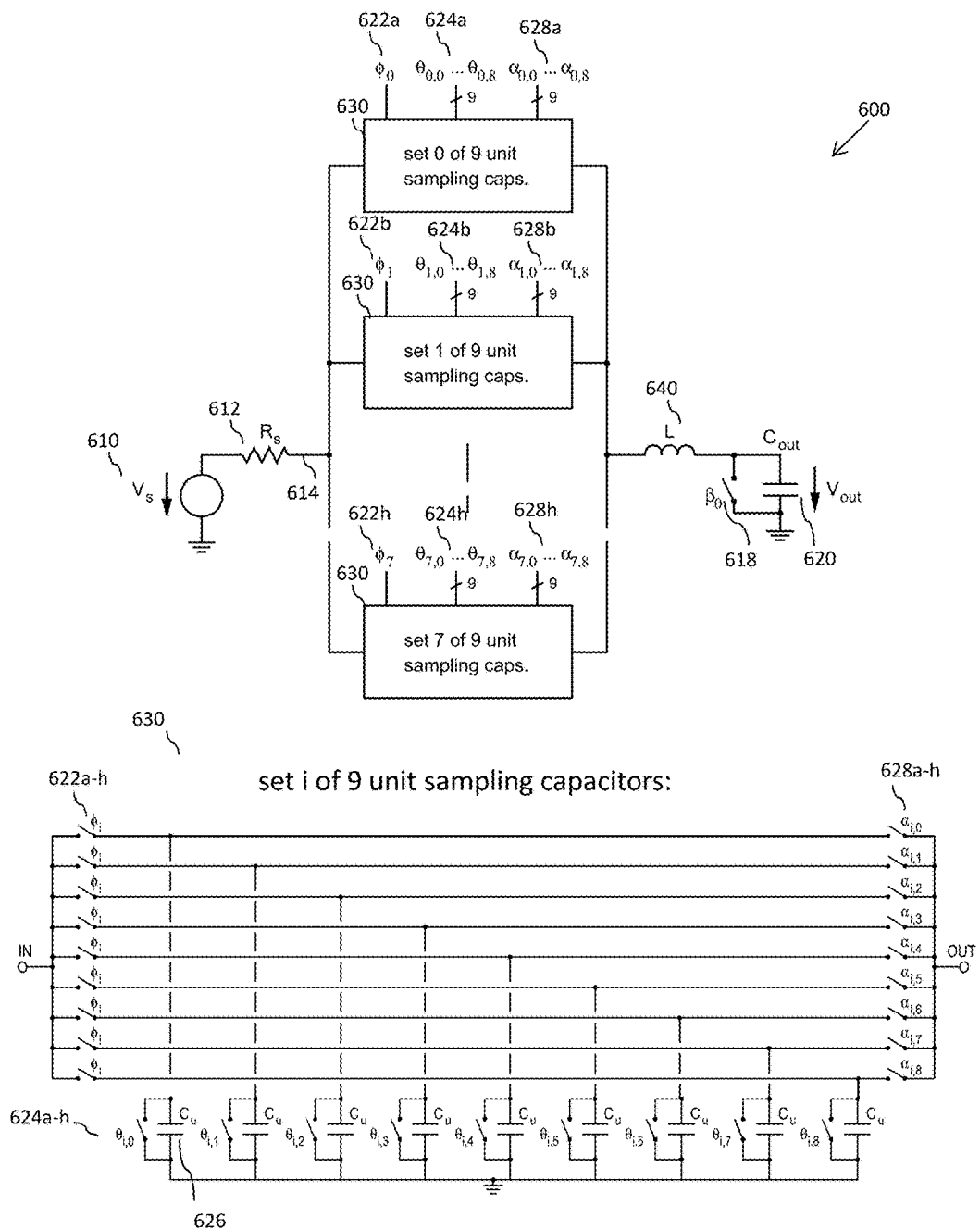
FIG. 6 illustrates a second example of a cascade-by-3 decimate-by-3 cascaded integrator-comb (CIC) FIR DTF, employing resonance charge transfer, and adapted in accordance with example embodiments of the invention.

Thus, and referring now to FIG. 6, a second example implementation of a filter with a transfer function corresponding (up to a multiplying constant coefficient) to one of a cascade of 3 decimate-by-3 cascaded integrator-comb (CIC) FIR DTF 600, is illustrated in accordance with example embodiments of the invention.

The example filter consists of 8 sampling elements, labelled "set 'i' of 9 unit sampling caps." (i=0, . . . , 7) in FIG. 6. Each sampling element in the CIC FIR DTF 600 consists of a set of nine unit sampling capacitors 630. The use of a set of nine unit sampling capacitors 630, instead of just one (as in the decimate-by-2 example of FIG. 3), is motivated by a desire to implement weighting factors to realize more general z-transform filter transfer functions. The sample 'i' weight to be used for constructing an output sample value is determined by the state of the nine output switches $\alpha_{i,k}$, where k=0.8, 628a-h and where the switches are controlled by the control signals with the same name shown in the timing diagram of FIG. 7. As in FIG. 3, the reset switches 624a-h can remove any charge history from the set of nine unit sampling capacitors 630.

Figure 7:
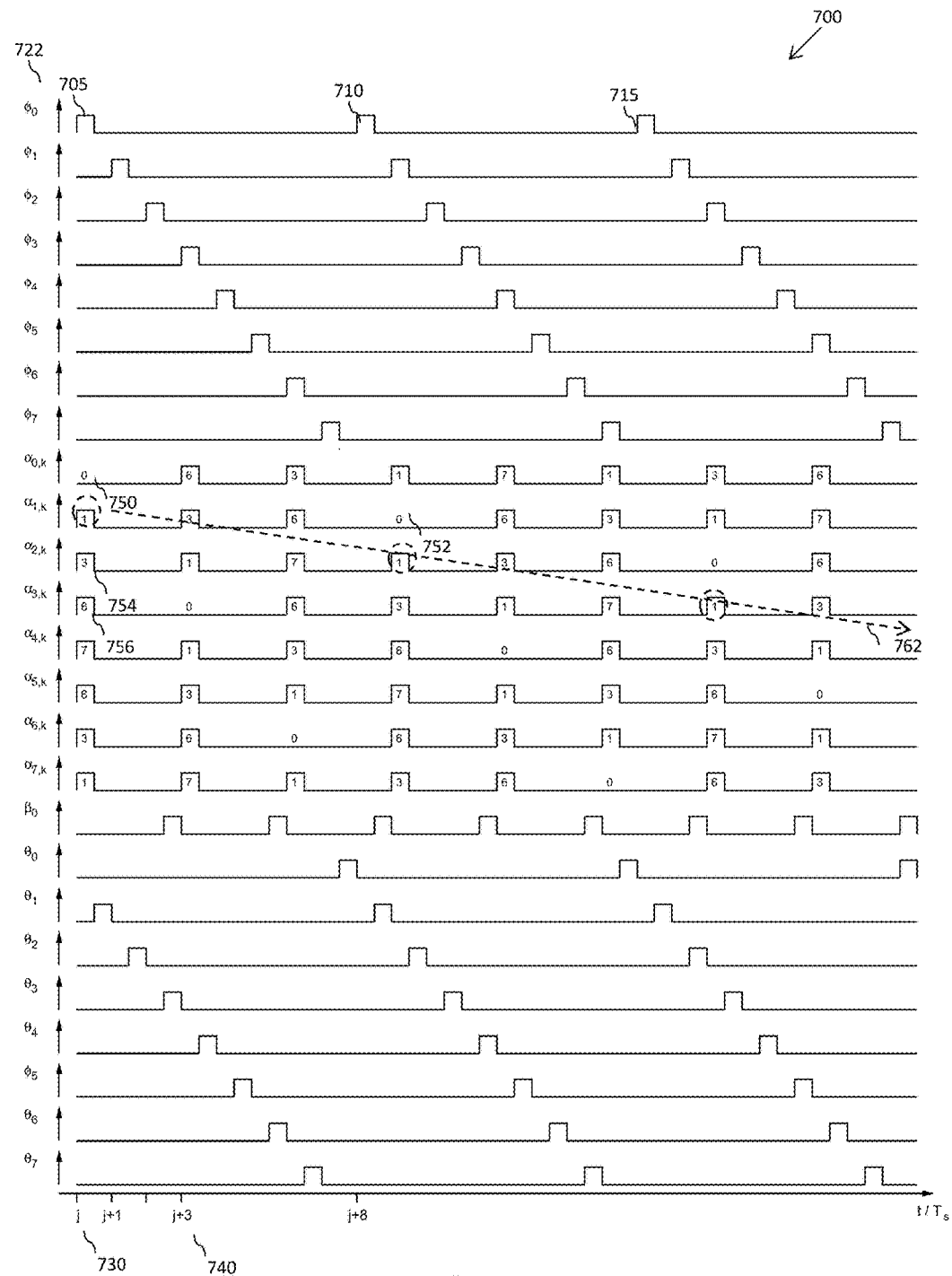
FIG. 7 illustrates a charge transfer and sampling timing diagram for the CIC FIR DTF of FIG. 6 in accordance with example embodiments of the invention.

In this example, it is proposed that the input signal is sampled on each unit sampling capacitor 626 of one sampling element 630 at a time, in a cyclic way as described by the signals $\varphi_0, \ldots \varphi_7$ of FIG. 7. However, in the same manner as described with respect to FIG. 3 and FIG. 4, when the sampled charge is used to build an output sample value, only a subset of the unit sampling capacitors of some sampling elements are connected to the output node. The number of unit sampling capacitors to be connected depends on the filter transfer function in equation [6] that is to be implemented.

Referring now to FIG. 7, a sampling and charge transfer timing diagram for the CIC FIR DTF of FIG. 6 is illustrated, in accordance with example embodiments of the invention. This is the full timing diagram of the full filter of FIG. 6. Thus, a combination of FIG. 6 and FIG. 7, namely the circuit and the timing diagram showing how the circuit control signals are sequenced, provides a full description of an implementation of the concept to realize a transfer function of the form of CIC N=3, R=3. FIG. 7 also illustrates all reset control signals, noting in the timing diagram $\theta_i = \theta_{i,0} = \theta_{i,1} = \theta_{i,2} = \theta_{i,3} = \theta_{i,4} = \theta_{i,5} = \theta_{i,6} = \theta_{i,7} = \theta_{i,8}$. In these examples, FIG. 7 shows the control signals, whereas the unit sampling capacitors are the 9 626 inside the 8 sampling elements (labelled 'set 0/ . . . /8 of 9 unit sampling capacitors) in FIG. 6.

In this example an output sample value is constructed every 3 input sampling periods. In FIG. 7, j denotes a point in time at which an output sample needs to be constructed. In particular, at time j the unit sampling capacitors of sampling element 0 are connected to the input for input sampling, 705 (labelled "set 0 of 9 unit sampling caps" in FIG. 6) as determined by $\varphi_0$ being high. At the same time, all other sampling elements (e.g. sampling elements 630 in FIG. 6) are being used to construct an output sample value. From the timing diagram it can be read that, of sampling element 1, 1 unit sampling capacitance is connected to the output ($\alpha_{1,k}$ is high indicating that sampling element 1 is being used). The number in the waveform at time j indicates how many units have to be connected to the output. Similarly we see control signal 754 in FIG. 7 relating to 3 unit sampling capacitors out of the 9 units 626 of sampling element 2, labelled 'set 2 of 9 unit sampling capacitors' in FIG. 6. Similarly we see control signal 756 in FIG. 7 relating to 6 unit sampling capacitors out of the 9 units 626 of sampling element 3, labelled 'set 2 of 9 unit sampling capacitors' in FIG. 6, and so on. Overall we see that the number of unit sampling capacitors used from each sampling element do match the coefficients of the z-Transform [6].

One sampling element may need to be used more than once before a new sample value is stored on each of its unit sampling capacitors. For example, from FIG. 7 we see that a new sampling value is stored on each of the unit sampling capacitors of sampling element 0 at times j, j+8, j+16, . . . . However, the value stored at time j on sampling element 0 is needed to construct an output sample at times j+3 and j+6. At time j+3, 6 unit sampling capacitors out of the 9 units 626 of FIG. 6, are needed and they can be chosen freely among the unit capacitors. However, at time j+6 the unit sampling capacitors used to build the previous sample are discharged and can't be used. Therefore, to construct the output sample at time j+6 we need to select 3 unit sampling capacitors among the ones not used to build a previous output sample. Similarly for each sampling element.

Analysing the timing diagram reveals that, for this particular example, with 9 unit sampling capacitors per sampling element the above constraint can be fulfilled.

At every point in time when an output sample is constructed, e.g. j+3 timing point 740, the timing diagram shows a vertical pattern of the coefficient weight numbers 0, 1, 3, 6, 7, 6, 3, 1 (at time instant j) or a cyclical rotation of them (6, 3, 1, 0, 1, 3, 6, 7 at time j+3 740). Thus the control signals controlling the output switches of the sampling elements are driven in a periodically repeating pattern 762.

A weight factor of zero, e.g. at time point 750 and 752, on an output switch control signal denotes that the unit sampling element to which the control signal refers are not used to construct the output sample value at that particular point in time. In general, in some examples, it is possible to implement a z-Transform where one coefficient is '0'. In that case a '0' in the weight of a waveform for a control signal $\alpha_{i,k}$ will not necessarily mean that the input is being sampled on sampling element i.

In this CIC FIR discrete time filter example, the use of the series inductor is the same as the much simpler decimate-by-2 example. However, it is shown in this example that the concept can be used to build filters where the weighting coefficients of the z-Transform are not all equal.

Figure 8:
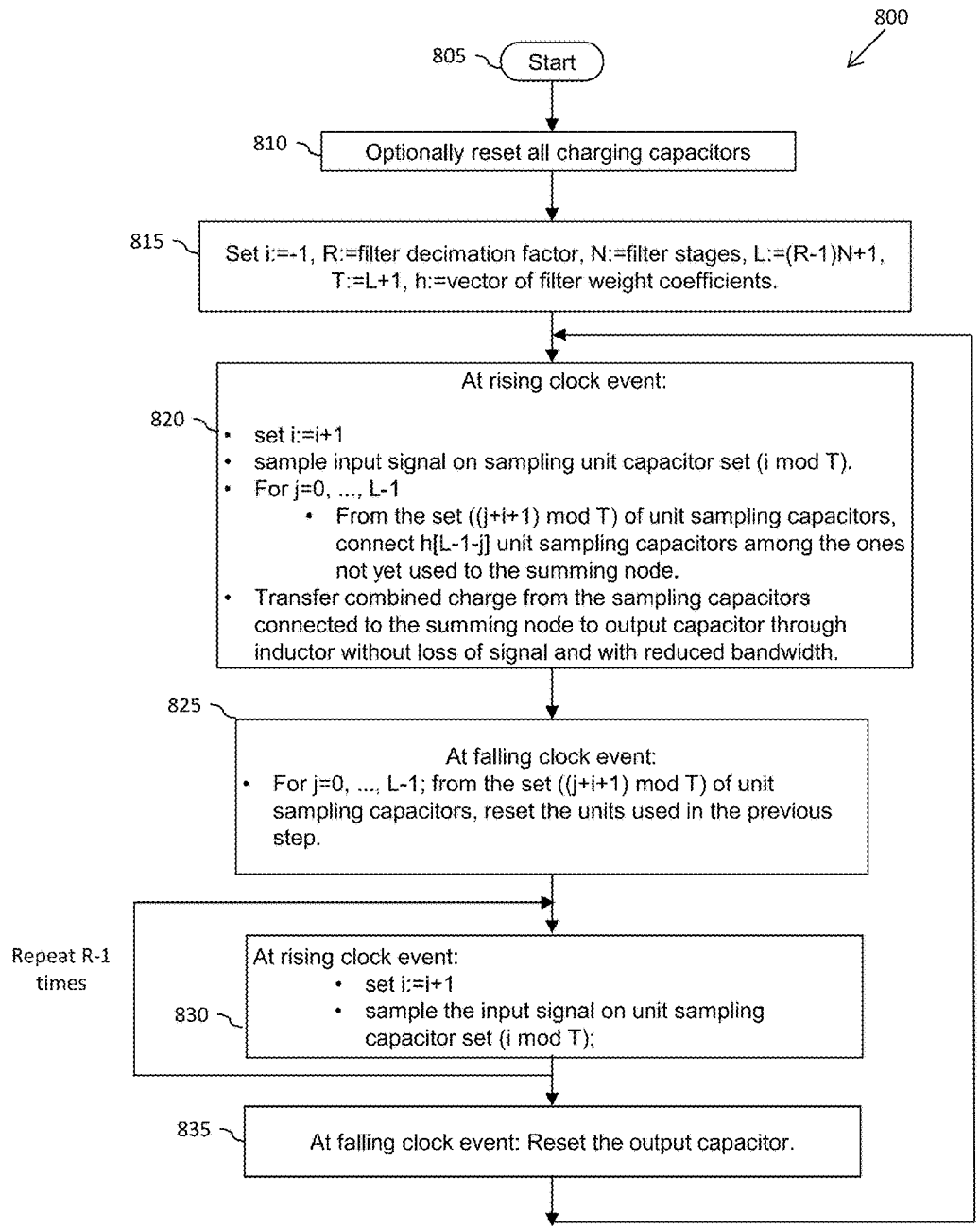
FIG. 8 illustrates a simplified flowchart of a method of constructing a DTF output value in accordance with example embodiments of the invention.

Referring now to FIG. 8, an example simplified flowchart 800 illustrates a method of constructing a discrete time filter output value through resonance charge transfer from the sets of input unit sampling capacitances to the output capacitance, according to examples of the invention.

The example simplified flowchart 800 encompasses an algorithm that is event-based and driven by a clock signal with a rising-edge and a falling-edge. In some examples, it is envisaged that the algorithm may encompass an exchange of rising-edges and falling-edges, or that the timing events can be replaced by events that are generated by a multi-phase clock generator with suitable adaptations.

In a CIC example implementation, it is noted that the parameters R and N are the standard parameters used to characterize Cascaded Integrator-Comb (CIC) filters as described, e.g., in E. Hogenauer, "An Economical Class of Digital Filters for Decimation and Interpolation", IEEE Trans. on Acoustics, Speech, and Signal Processing, Vol. ASSP-29, No. 2, April 1981 which is herein incorporated by reference in its entirety.

The example simplified flowchart 800 encompasses a multitude of filter implementations, including the aforementioned decimate-by-2 FIR DTF and cascade of 3 decimate-by-3 CIC FIR DTF. The notation h[k] means the k-th element of the zero based vector h.

In the first example of a decimate-by-2 FIR DTF: R=2, N=1, h=(1,1); whereas, in the second example of a cascade of 3 (N=3), decimation by 3 (R=3), CIC FIR DTF: R=3, N=3, h=(1, 3, 6, 7, 6, 3, 1).

The example simplified flowchart 800 commences at 805 and optionally resets all charging capacitors at 810. At 815, filter values may be set, e.g. Set i:=−1, R:=filter decimation factor, N:=filter stages, L:=(R−1)N+1, T:=L+1, h:=vector of filter weight coefficients. At 820, at a rising clock event: i:=i+1 is set and the input signal may be sampled on a sampling unit capacitor set (i mod T) (previously also referred to as sampling element (j mod T)). For j=0, . . . , L−1, and from the set ((j+i+1) mod T) of unit sampling capacitors, unit sampling capacitors h[L−1−j] among the ones not yet used, are connected to the summing node. The combined charge from the sampling capacitors connected to the summing node is then transferred to the output capacitor through the series inductor without loss of signal and with reduced bandwidth.

At 825, at a falling clock event and for j=0, . . . , L−1 and from the set ((j+i+1) mod T) of unit sampling capacitors, the unit sampling capacitors used in 820 may be reset.

At 830, this operation is repeated R−1 times, following at a rising clock event: set i:=i+1; and sample the input signal on unit sampling capacitor set (i mod T). Thereafter, the process moves to 835, where the output capacitor is reset following a falling clock event. The process then loops to 820.

Figure 9:
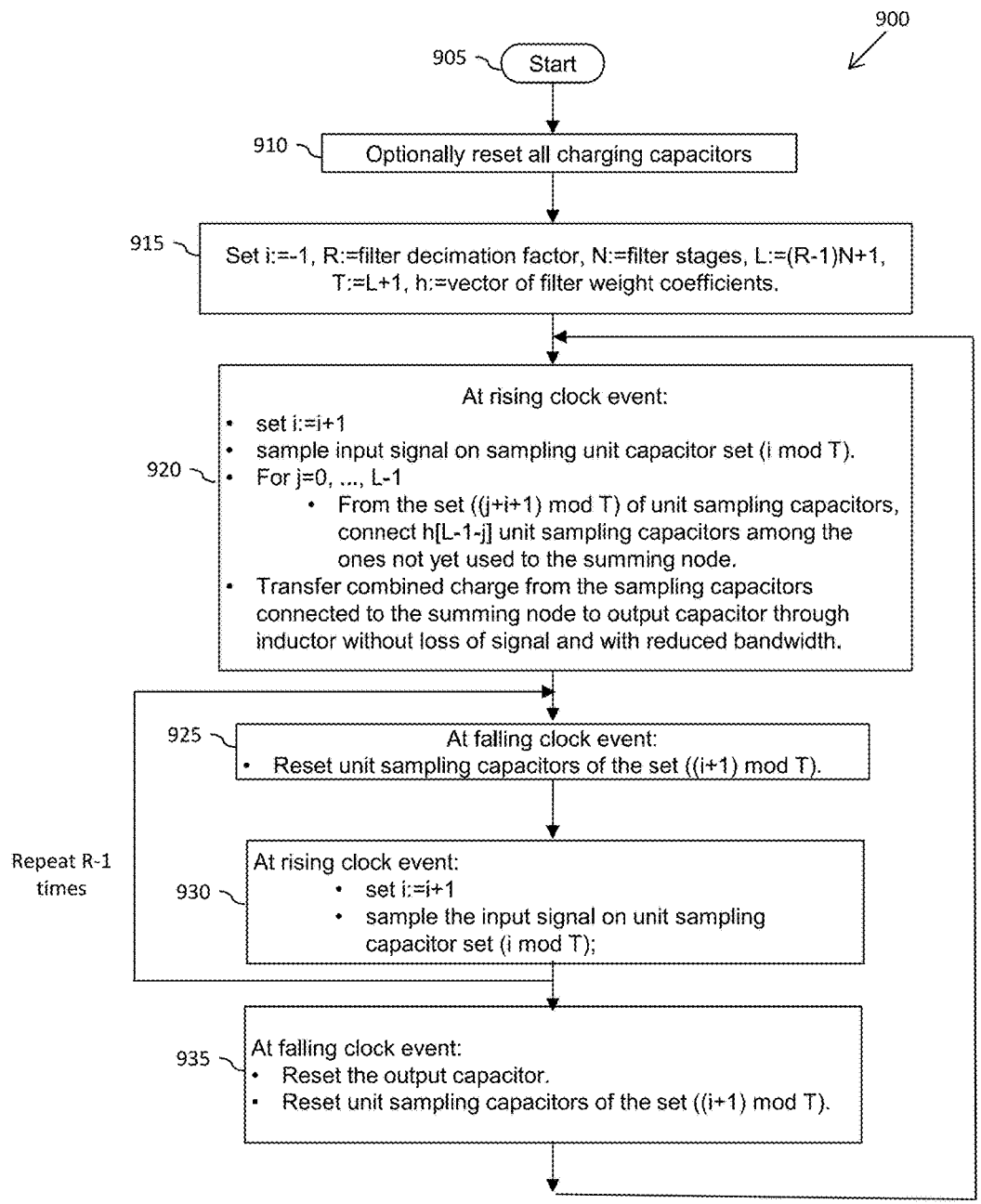
FIG. 9 illustrates a simplified flowchart of a method of constructing a DTF output value when the reset switches are operated in accordance with example embodiments of the invention.

Referring now to FIG. 9, a simplified flowchart 900 of a method of constructing a DTF output value when the reset switches are operated, and through resonance charge transfer from the sets of input unit sampling capacitances to the output capacitance, is illustrated in accordance with example embodiments of the invention.

The example simplified flowchart 900 encompasses an algorithm that is event-based and driven by a clock signal with a rising-edge and a falling-edge. In some examples, it is envisaged that the algorithm may encompass an exchange of rising-edges and falling-edges, or that the timing events can be replaced by events that are generated by a multiphase clock generator with suitable adaptations.

In a CIC example implementation, it is noted that the parameters R and N are the standard parameters used to characterize Cascaded Integrator-Comb (CIC) filters as described, e.g., in E. Hogenauer, "An Economical Class of Digital Filters for Decimation and Interpolation", IEEE Trans. on Acoustics, Speech, and Signal Processing, Vol. ASSP-29, No. 2, April 1981.

The example simplified flowchart 900 encompasses a multitude of filter implementations, including the aforementioned decimate-by-2 FIR DTF and cascade of 3 decimate-by-3 CIC FIR DTF. The notation h[k] means the k-th element of the zero based vector h.

In the first example of a decimate-by-2 FIR DTF: R=2, N=1, h=(1,1); whereas, in the second example of a cascade of 3 (N=3), decimation by 3 (R=3), CIC FIR DTF: R=3, N=3, h=(1, 3, 6, 7, 6, 3, 1).

The example simplified flowchart 900 commences at 905 and optionally resets all charging capacitors at 910. At 915, filter values may be set, e.g. Set i:=−1, R:=filter decimation factor, N:=filter stages, L:=(R−1)N+1, T:=L+1, h:=vector of filter weight coefficients. At 920, at a rising clock event: i:=i+1 is set and the input signal may be sampled on a sampling unit capacitor set (i mod T) (previously also referred to as sampling element (j mod T)). For j=0, . . . , L−1, and from the set ((j+i+1) mod T) of unit sampling capacitors, unit sampling capacitors h[L−1−j] among the ones not yet used, are connected to the summing node. The combined charge from the sampling capacitors connected to the summing node is then transferred to the output capacitor through the series inductor without loss of signal and with reduced bandwidth.

At 925, at a falling clock event, the unit sampling capacitors of the set ((i+1) mod T) may be reset. At 930, following at a rising clock event: set i:=i+1; and the input signal is sampled on the unit sampling capacitor set (i mod T). The operation of 925 and 930 is repeated R−1 times.

Thereafter, at 935 and at a falling clock event, the output capacitor is reset and the sampling capacitors of the set ((i+1) mod T) are reset. The process then loops to 920.

Although examples of the invention have been described in terms of a decimate-by-2 hardware-based DTF design, and a cascade of 3 (N=3) decimation by 3 (R=3) CIC FIR DTF, it is envisaged that the concepts described herein can be applied to a large set of FIR DTF filter types or configurations, for example to address problems of signal attenuation and/or noise.

In some examples, some or all of the steps illustrated in the flowchart may be implemented in hardware and/or some or all of the steps illustrated in the flowchart may be implemented in firmware.

In particular, it is envisaged that the aforementioned inventive concept can be applied by a semiconductor manufacturer to any integrated circuit comprising a synthesizer or other timing signal generation component. It is further envisaged that, for example, a semiconductor manufacturer may employ the inventive concept in a design of a stand-alone device, such as an application-specific integrated circuit (ASIC) and/or any other sub-system element.

It will be appreciated that, for clarity purposes, the above description has described embodiments of the invention with reference to different functional units. However, it will be apparent that any suitable distribution of functionality between different functional units may be used without detracting from the invention. Hence, references to specific functional units are only to be seen as references to suitable means for providing the described functionality, rather than indicative of a strict logical or physical structure or organization.

Aspects of the invention may be implemented in any suitable form including hardware, software, firmware or any combination of these. The invention may optionally be implemented, at least partly, as computer software running on one or more data processors and/or digital signal processors or configurable module components such as FPGA devices. Thus, the elements and components of an embodiment of the invention may be physically, functionally and logically implemented in any suitable way. Indeed, the functionality may be implemented in a single unit, in a plurality of units or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Thus, an improved FIR DTF and method of operation therefor have been described, wherein the aforementioned disadvantages with prior art arrangements have been substantially alleviated.

I claim:

1. A discrete time filter, DTF, for effecting a resonant charge transfer, the DTF comprising:
    a summing node;
    N parallel branches, each branch having a set of input unit sampling capacitances where each input unit sampling capacitance is independently selectively coupleable to the summing node; and
    an output capacitance connected to the summing node such that a resonant charge transfer is effected;
  wherein
    the output capacitance has a value equal to a sum of the sampling capacitances that are to be selectively connected to the summing node; and
    the discrete time filter further comprises a series inductance connected between the summing node and the output capacitance.

2. The discrete time filter of claim 1, wherein the series inductance, in combination with the output capacitance and the input unit sampling capacitances located at either side of the series inductance are configured to effect resonance at a frequency to facilitate a resonant charge transfer.

3. The discrete time filter of claim 2, wherein each input unit sampling capacitance is independently selectively coupleable to the summing node via a respective output switch, wherein the resonance frequency of an output resonant circuit that comprises the set of input unit sampling capacitances coupled to the output capacitance via the inductance, is based on a time interval τ during which the output switches are closed.

4. The discrete time filter of claim 2, wherein the resonant charge transfer comprises all of the charge being transferred from the respective set of input unit sampling capacitances to the output capacitance, $C_{out}$.

5. The discrete time filter of claim 1, wherein the output capacitance, $C_{out}$, is equal to a total capacitance of the set of unit sampling capacitances that are individually and selectively connected to an output node of the DTF at an instant in time.

6. The discrete time filter of claim 1, wherein each input unit sampling capacitance of each of the N parallel branches, is coupled to an input switch, a reset switch and an output switch, and the output capacitance, $C_{out}$, is coupled to an output capacitor reset switch.

7. The discrete time filter of claim 6, wherein the series inductance, in combination with the output capacitance and the input unit sampling capacitances located at either side the series inductance are configured to effect a resonant charge transfer during a period of time between a rising clock event whereby the sampling capacitances of a number of selected N parallel branch are coupled to the output capacitance and a falling clock event that disconnects the sampling capacitances of the number of selected N parallel branch from the output capacitance.

8. The discrete time filter of claim 6, further comprising a controller coupled to each switch and configured to effect a switch close time of the output switches that is one half of a period of a resulting resonant charge transfer.

9. The discrete time filter of claim 1, wherein the set of input unit sampling capacitances, $C_s$, is configured to form a decimate-by-2 finite impulse response, FIR, DTF.

10. The discrete time filter of claim 1 wherein the set of input unit sampling capacitances, $C_s$, is configured to form a cascade-by N decimate-by-N cascaded integrator-comb (CIC) finite impulse response, FIR, DTF.

11. The discrete time filter of claim 10 wherein the series inductance in the CIC FIR DTF is used to build a filter where weighting coefficients of a z-Transform representative of the CIC FIR DTF are not all equal.

12. A wireless communication unit comprising a discrete time filter, DTF, for effecting a resonant charge transfer, the DTF comprising:
    a summing node;
    N parallel branches, each branch having a set of input unit sampling capacitances where each unit sampling capacitance is independently selectively coupleable to the summing node; and
    an output capacitance connected to the summing node such that a resonant charge transfer is effected;
  wherein
    the output capacitance has a value equal to a sum of the sampling capacitances that are to be selectively connected to the summing node; and
    the discrete time filter further comprises a series inductance connected between the summing node and the output capacitance.

13. The wireless communication unit of claim 12, wherein the series inductance in combination with the output capacitance and the input unit sampling capacitances located at either side of the series inductance are configured to effect resonance at a frequency to facilitate a resonant charge transfer.

14. The wireless communication unit of claim 13, wherein each input unit sampling capacitance is independently selectively coupleable to the summing node via a respective output switch, wherein the resonance frequency of an output resonant circuit that comprises the set of input unit sampling capacitances coupled to the output capacitance via the inductance, is based on a time interval, τ, during which the output switches are closed.

15. The wireless communication unit of claim 13, wherein the resonant charge transfer comprises all of the charge being transferred from the respective set of input unit sampling capacitances to the output capacitance, $C_{out}$.

16. A method of effecting a resonant charge transfer in a discrete time filter comprising a summing node and N parallel branches, each branch having a set of input unit sampling capacitances and an output capacitance connected to the summing node; the method comprising:
    independently selectively coupling a plurality of unit sampling capacitances to the summing node, which is connected to an output capacitance via an inductance, wherein the output capacitance has a value equal to a sum of the sampling capacitances that are selectively coupled to the summing node; and
    effecting a resonant charge transfer from the selected plurality of unit sampling capacitances to the output capacitance.

17. The method of claim 16, wherein the output capacitance, inductance, and sampling capacitances that are selectively coupled to the inductance form an output resonant circuit where the resonant frequency is based on a time interval, τ, during which output switches of the DFT coupling the plurality of unit sampling capacitances to the output capacitance are closed.

18. The method of claim 17, wherein the time interval, τ, corresponds to half a resonance period of the output resonant circuit formed by the inductor and the capacitors connected to it.

19. The method of claim 16, wherein effecting a resonant charge transfer from the selected plurality of unit sampling capacitances to the output capacitance comprises the resonant charge transfer transferring all of the charge from the respective set of input unit sampling capacitances to the output capacitance.

20. The method of claim 16, wherein the output capacitance, $C_{out}$, is equal to a total capacitance of the set of unit sampling capacitances that are individually and selectively connected to an output node of the DTF at an instant in time.

* * * * *